United States Patent
Kranz

(10) Patent No.: US 7,053,676 B2
(45) Date of Patent: May 30, 2006

(54) CIRCUIT ARRANGEMENT FOR GENERATING A SIGNAL HAVING A SPECIFIC WAVEFORM WITH AN ADJUSTABLE VOLTAGE LEVEL

(75) Inventor: Christian Kranz, Ratingen Lintorf (DE)

(73) Assignee: Infineon Technologies AG., München (DE)

( * ) Notice: Subject to any disclaimer, the term of this patent is extended or adjusted under 35 U.S.C. 154(b) by 406 days.

(21) Appl. No.: 10/141,558

(22) Filed: May 8, 2002

(65) Prior Publication Data

US 2003/0025534 A1 Feb. 6, 2003

Related U.S. Application Data

(63) Continuation of application No. PCT/EP00/10990, filed on Nov. 7, 2000.

(30) Foreign Application Priority Data

Nov. 9, 1999 (DE) .................... 199 53 884

(51) Int. Cl.
*H03K 3/00* (2006.01)
(52) U.S. Cl. ............... 327/108; 328/110; 328/437
(58) Field of Classification Search ........ 327/108–112, 327/436, 437
See application file for complete search history.

(56) References Cited

U.S. PATENT DOCUMENTS

| | | | | |
|---|---|---|---|---|
| 4,353,115 A | | 10/1982 | Ruble et al. | |
| 4,634,903 A | * | 1/1987 | Montorfano | 327/432 |
| 4,648,019 A | * | 3/1987 | Stahl | 363/43 |
| 4,695,931 A | | 9/1987 | Yamaura et al. | |
| 4,980,576 A | * | 12/1990 | Rossi et al. | 327/109 |
| 5,220,204 A | * | 6/1993 | Burkhead | 327/108 |
| 5,394,146 A | | 2/1995 | Arimoto | |
| 5,663,667 A | * | 9/1997 | Blum et al. | 327/134 |
| 5,731,731 A | * | 3/1998 | Wilcox et al. | 327/403 |
| 5,892,389 A | * | 4/1999 | Lai | 327/543 |
| 6,512,346 B1 | * | 1/2003 | Yoshimura | 318/599 |
| 6,614,288 B1 | * | 9/2003 | Dagan et al. | 327/365 |
| 6,642,697 B1 | * | 11/2003 | Zuniga et al. | 323/223 |
| 6,650,169 B1 | * | 11/2003 | Faye et al. | 327/404 |

FOREIGN PATENT DOCUMENTS

| | | |
|---|---|---|
| DE | 42 13 096 A1 | 10/1993 |
| DE | 36 88 952 T2 | 12/1993 |
| DE | 43 20 691 C2 | 9/1995 |
| GB | 2 066 005 A | 7/1981 |

* cited by examiner

*Primary Examiner*—Kenneth B. Wells
(74) *Attorney, Agent, or Firm*—Marshall, Gerstein & Borun LLP

(57) ABSTRACT

A circuit arrangement for generating specific waveforms includes a controllable voltage transformer circuit for generating an output signal ($V_{OUT}$) with a specific waveform, which increases the voltage of its output signal depending on a first control signal ($V_H$) or reduces it depending on a second control signal ($V_L$). The arrangement also includes a control unit that generates the first and second control signal ($V_H$, $V_L$) for the voltage transformer circuit depending on a reference signal ($V_{REF}$) in the form of an open-loop control or in the form of a closed-loop control.

10 Claims, 2 Drawing Sheets

US 7,053,676 B2

CIRCUIT ARRANGEMENT FOR GENERATING A SIGNAL HAVING A SPECIFIC WAVEFORM WITH AN ADJUSTABLE VOLTAGE LEVEL

RELATED APPLICATIONS

This is a continuation of International Application Ser. No. PCT/EP00/10990, with an international filing date of Nov. 7, 2000, published in German under PCT Article 21(2).

FIELD OF THE INVENTION

The present invention relates to a circuit arrangement for generating specific waveforms, in particular waveforms which can be used for generating sound in (mobile) telephones.

BACKGROUND

In order to generate sound in telephones, it is necessary to produce a signal with any waveform and an adjustable voltage level (amplitude). The signal generated in this manner can then be transformed into sound waves with the aid of capacitive sound transducers, for example.

For multi-tone calling, in particular, such as used in modern telephony, it is necessary to provide a circuit arrangement that can generate the signal described above in the desired waveform. Known circuit arrangements use a relatively high constant supply voltage for this purpose in order to derive the desired signal with the aid of an appropriate voltage transformer.

SUMMARY

According to an aspect, a circuit arrangement is provided for generating waveforms, the arrangement having a voltage transformer circuit for generating an output signal with a specific waveform. The arrangement includes a control circuit that is configured to activate the voltage transformer circuit, wherein the control circuit generates a first control signal and a second control signal to activate the voltage transformer circuit. The voltage transformer circuit is configured so that a voltage of the output signal is increased by application of the first control signal and reduced by application of the second control signal.

DETAILED DESCRIPTION OF THE PREFERRED EXAMPLES

Figure 1:
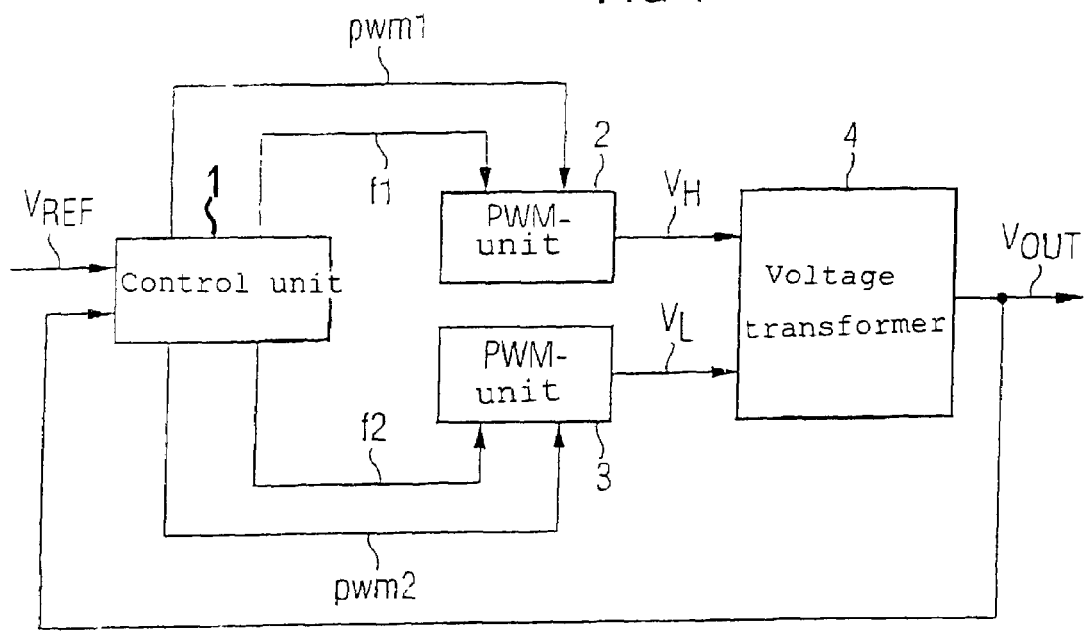
FIG. 1 is a schematic block diagram of a circuit arrangement for generating waveforms according to the present disclosure.

The circuit arrangement illustrated in FIG. 1, which may be used in mobile telephones for multi-tone calling, has a DC/DC voltage transformer 4, which may be in the form of a DC/DC up-controller with voltage reduction capability. The voltage transformer 4 is therefore in a position to both increase and decrease its output voltage $V_{OUT}$.

The voltage transformer 4, which modulates the waveform of its output signal $V_{OUT}$, is activated via two control signals $V_H$ and $V_L$, the output voltage $V_{OUT}$ being increased by means of the control signal $V_H$ and reduced by means of the control signal $V_L$. Every control signal $V_H$ or $V_L$ is generated by a corresponding pulse width modulation unit (PWM unit) 2 or 3, which modulates the frequency and/or pulse width of the respective pulse-shaped control signals depending on modulation signals which are pre-set from a control unit 1. The PWM unit 2 and 3, along with the control unit 1, collectively comprise a control circuit.

The control unit 1 receives a reference signal $V_{REF}$, which it compares with the actual value of the output signal $V_{OUT}$. Depending on the result of the comparison, pulse width modulation signals pwm1 and pwm2 for modulating the pulse width and/or frequency modulation signals f1 and f2 for modulating the frequency of the control signals $V_H$ and $V_L$ are generated. The pulse width modulation and frequency modulation signals are pre-set for PWM unit 2 and PWM unit 3, enabling the PWM units 2 and 3 to produce the control signals $V_H$ and $V_L$ depending on the respective pre-set modulation values. Accordingly, the pulse width and/or the frequency of the pulse-shaped control signals $V_H$ and $V_L$ is controlled or adjusted depending on the reference signal $V_{REF}$ in such a way that the desired waveform occurs at the output of the voltage transformer, the output voltage $V_{OUT}$ being increased by pulses at the input of the voltage transformer 4 assigned to the control signal $V_H$ and reduced by pulses at the input assigned to the control signal $V_L$. Thus, the circuit arrangement illustrated in FIG. 1 corresponds in principle to a delta-modulated DC/DC transformer.

Figure 2:
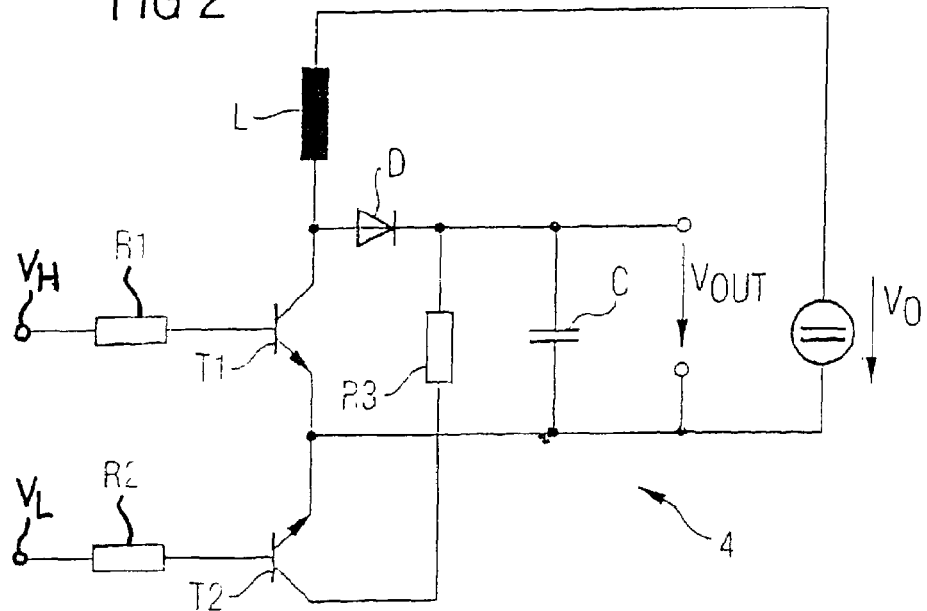
FIG. 2 illustrates a circuit design for the voltage transformer illustrated in FIG. 1.

FIG. 2 illustrates one possible configuration of the voltage transformer 4, in which the voltage transformer 4 is set up as a circuit operating on a supply voltage $V_0$ and comprises two bipolar transistors T1, T2, a coil L, a diode D, a capacitor C and resistors R1–R3. As shown, the transistor T1 and coil L are connected in series. The diode D and capacitor C are also connected in series, this series connection being in parallel with transistor T1. Furthermore, the transistor T2 is shown connected in series with resistor R3, this series connection being in parallel with the capacitor C. Also, the emitters of the transistors T1 and T2 are connected together.

As illustrated in FIG. 2, the individual components are connected so that the control signal $V_H$ is applied via the terminal resistor R1 to the base terminal of the bipolar transistor T1 and the control signal $V_L$ via the terminal resistor R2 to the base terminal of the bipolar transistor T2. The output voltage $V_{OUT}$ maybe tapped from the capacitor C, as shown. As mentioned above, the output voltage $V_{OUT}$ is increased by $V_H$ pulses at the bipolar transistor T1 and decreased by $V_L$ pulses at the bipolar transistor T2.

Either the pulse width or the frequency or alternatively both the pulse width and the frequency of the two control signals $V_H$ and $V_L$ may be modulated by the control unit 1, the circuit arrangement illustrated in FIG. 1 being guaranteed to function in each of these situations.

To illustrate the simplicity of the system, an example of an embodiment will be described below, in which the two PWM units 2 and 3 are operated at a constant frequency and only the pulse width of the two control signals $V_H$ and $V_L$ is modulated by the control unit 1 and PWM units 2 and 3. This being the case, the pulse width may be digitally modulated using counters, which are operated at a higher clock rate. The frequency of the two PWM units 2 and 3 may be 128 kHz, for example, while the counter rate is 10.368 MHz, which means that there are 81 different pulse widths for the two control signals $V_H$ and $V_L$.

The control unit 1 operates digitally and determines the pulse width to be modulated by the two PWM units 2 and 3 from the differential signal e(k) of the reference signal x(k) and the output signal y(k), i.e., e(k)=x(k)−y(k), where k respectively denotes the sampling time. The control unit 1 defines the value of the pulse width PW depending on the differential signal e(k) as follows:

If $e(k)>0$: $PW = mt;epmrl;\sqrt{2 \cdot italC \cdot Lmed}$
(beginbold2endboldital·emed(italkmed)·italymed
(italkmed)+italemed(italkmed)·italemed(italkmed))rlxmx/(T·V_0)

If $e(k)<0$: $PW = -R \cdot C \cdot \ln(y(k)/(y(k)+e(k))/T$ where C denotes the value of the capacitor illustrated in FIG. 2, L the inductance value of the coil, R the value of the resistor R3 illustrated in FIG. 2, 1/T the frequency of the PWM units 2 and 3 and the two control signals $V_H$ and $V_L$, and $V_0$ is the value of the supply voltage illustrated in FIG. 2. In order to reduce complexity, the above values for the pulse width PW may be determined on an approximate basis, such as by means of a polynomial approximation, for example.

Figure 3A:
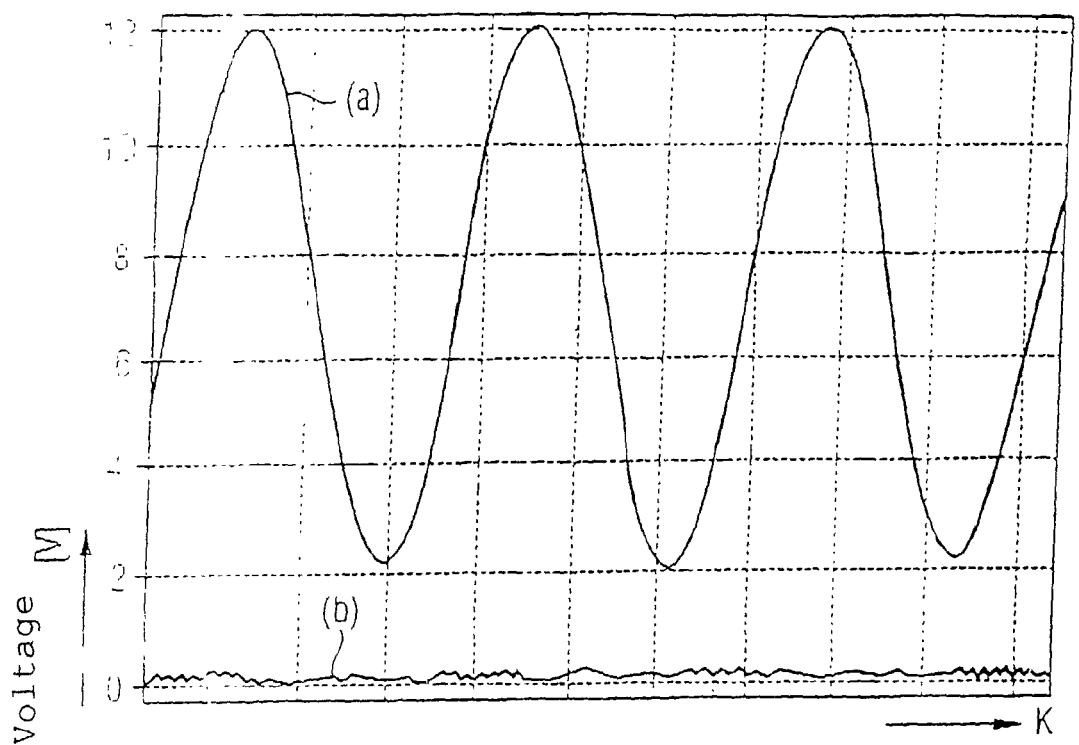
FIGS. 3A and 3B are signal curves illustrating how the circuit arrangement illustrated in FIG. 1 operates.
Figure 3B:
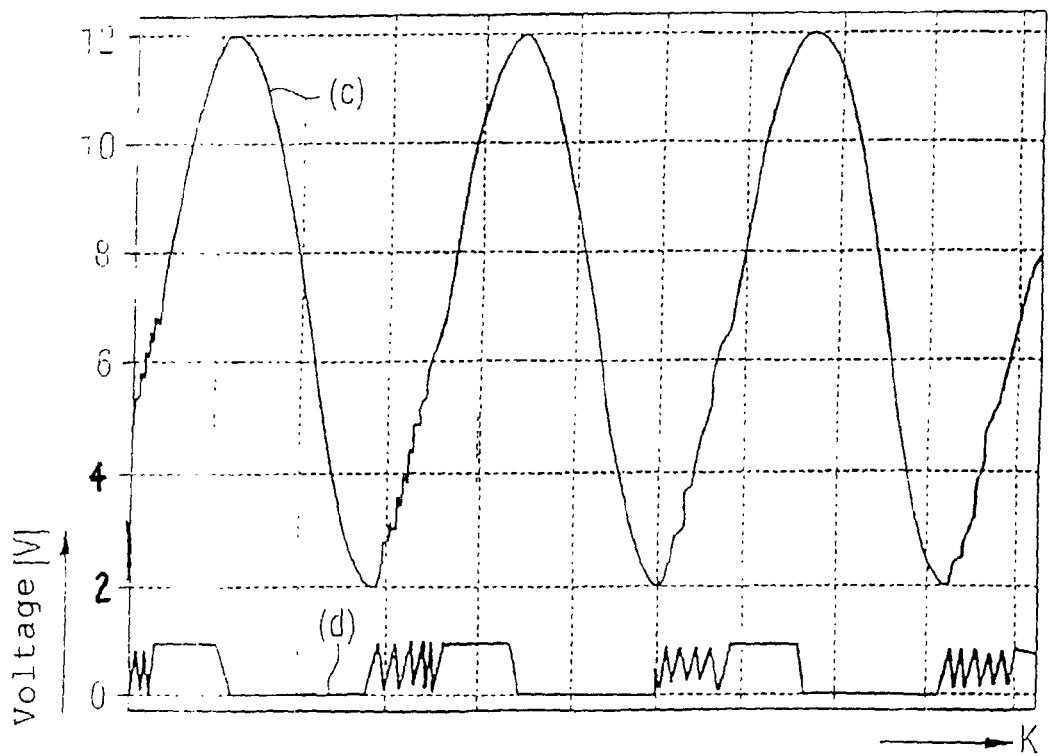

FIGS. 3A and 3B illustrate different signal curves for the circuit arrangement illustrated in FIG. 1 for various discrete sampling times k where C=30nF, L=47μH, R=330Ω, $V_0$=2.65V and T=1/128 kHz. The signal curve (a) given in FIG. 3A corresponds to the reference signal $V_{REF}$ and the signal curve (b) corresponds to the signal pwm1 or pwm2, while the signal curve (c) in FIG. 3B corresponds to the output signal $V_{OUT}$ and the signal curve (d) corresponds to the control voltages $V_H/V_L$ where $V_H$="1" and $V_L$="0".

The complexity of the circuit can be reduced if the two control signals $V_H$ and $V_L$ are generated without feedback, i.e., without evaluating the output voltage $V_{OUT}$ of the voltage transformer 4. This being the case, there is no closed loop control but merely open-loop control, wherein the control unit 1 determines the value of the pulse width PW depending on the reference signal x(k) at constant frequency of the PWM units 2 and 3 as follows:

For $x(k) > x(k-1)$: $PW = -\frac{L}{R_{EC} \cdot T} \cdot \ln\left(1 - \frac{R_{EC}}{V_0} \cdot \sqrt{\frac{C}{L}(x^2(k) = x^2(k-1))}\right)$ For $x(k) < x(k-1)$: $PW = -\frac{R \cdot C}{T} \cdot (\ln(x(k-1)) - \ln(x(k)))$ where $R_{EC}$ in the above formulas denotes the emitter-collector resistance of the bipolar transistor T1.

The present disclosed circuit arrangement is therefore useful for generating waveforms using relatively simple means and is highly reliable and accurate. To achieve this, a voltage transformer circuit is used, to which a first and a second control signal is applied. The voltage transformer circuit is provided with the capability of both increasing voltage and reducing voltage, the first control signal being used to increase and the second control signal being used to decrease the output voltage of the voltage transformer circuit. The voltage transformer circuit is activated by modulating the frequency and/or pulse width of the two control signals, the frequency and/or the pulse width of the control signals being regulated or modulated, depending on a reference signal, so that the desired waveform is applied to the output of the voltage transformer circuit.

Moreover, the described circuit arrangement may be configured both as an open loop control without feedback of the output voltage of the voltage transformer circuit or as a closed loop control with feedback of the output voltage of the voltage transformer circuit. The first option reduces the complexity of the circuit whilst the second enables a more accurate output signal of the voltage transformer circuit to be produced.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A circuit arrangement for generating waveforms, comprising:
    a voltage transformer circuit for generating an output signal with a specific waveform; and
    a control circuit configured to control the voltage transformer circuit;
    wherein the control circuit generates a first pulse-shaped control signal and a second pulse-shaped control signal to control the voltage transformer circuit;
    wherein the voltage transformer circuit is configured so that a voltage of the output signal is increased by each pulse of the first pulse-shaped control signal and reduced by each pulse of the second pulse-shaped control signal; and
    wherein the voltage transformer circuit comprises:
    a first series circuit operated with a supply voltage and including an inductance coil and a first controllable semiconductor switch;
    a second series circuit including a rectifier element and a capacitor and connected in parallel with the first controllable semiconductor switch of the first series circuit, wherein a voltage across the capacitor is tapped for the output signal of the voltage transformer; and
    a second controllable semiconductor switch which is connected between a connection between the rectifier element and a first terminal of the capacitor on the one hand and a second terminal of the capacitor on the other;
    wherein the first controllable semiconductor switch is activated by the first control signal and the second controllable semiconductor switch is activated by the second control signal.

2. A circuit arrangement as defined in claim 1, wherein the control circuit is configured to generate the first control signal and the second control signal each with a variable pulse width.

3. A circuit arrangement as defined in claim 2, wherein the control circuit comprises a control unit, a first pulse width modulation unit and a second pulse width modulation unit;
    the control unit is configured to generate a first modulation signal for the first pulse width modulation unit and a second modulation signal for the second pulse width modulation unit; and
    the first and second pulse width modulation units are configured to modulate the pulse widths of the respective first and second control signals applied to the voltage transformer circuit dependent on the corresponding first and second modulation signals, and
    the voltage transformer circuit is configured so that it increases the voltage of the output signal dependent on the pulse width of the first control signal applied by the first pulse width modulation unit and reduces the voltage of the output signal depending on the pulse width of the second control signal applied by the second pulse width modulation unit.

4. A circuit arrangement as defined in claim 1, wherein the control circuit is configured to generate the first and second control signals each with a variable frequency.

5. A circuit arrangement as defined in claim 4, wherein the control circuit comprises a control unit, a first pulse width modulation unit and a second pulse width modulation unit;

the control unit is configured to generate a first modulation signal for the first pulse width modulation unit and a second modulation signal for the second pulse width modulation unit;

the first and second pulse width modulation units are configured to modulate the frequency of the first and second control signals applied to the voltage transformer circuit dependent on the corresponding first and second modulation signals; and the voltage transformer circuit is configured to increase the voltage of the output signal dependent on the frequency of the first control signal from the first pulse width modulation unit and reduce the voltage of the output signal dependent on the frequency of the second control signal from the second pulse width modulation unit.

6. A circuit arrangement as defined in claim 1, wherein the first and second controllable semiconductor switches each comprise a bipolar transistor, where an emitter of the first semiconductor switch is connected to an emitter of the second semiconductor switch, a collector of the first semiconductor switch is connected to a first terminal of the rectifier element and a collector of the second semiconductor switch is connected via a resistor to a second terminal of the rectifier element; and wherein the first control signal is applied to a base of the first semiconductor switch and the second control signal is applied to a base of the second semiconductor switch.

7. A circuit arrangement as defined in claim 6, wherein the control circuit comprises a control unit, a first pulse width modulation unit and a second pulse width modulation unit and is configured to generate the first and second control signals applied to the voltage transformer circuit independent of the output signal of the voltage transformer circuit and dependent on a reference signal; and wherein the first and second pulse width modulation units generate the first and second control signals, respectively, at a constant frequency and the control unit is configured to define a pulse width of the first and second pulse width modulation units at least approximately on the basis of the expression:

$$-\frac{L}{R_{EC} \cdot T} \cdot \ln\left(1 - \frac{R_{EC}}{V_0} \cdot \sqrt{\frac{C}{L}(x^2(k) = x^2(k-1))}\right) \text{ when } x(k) > x(k-1),$$

and define the pulse width of the first and second pulse width modulation units at least approximately on the basis of the expression:

$$-\frac{R \cdot C}{T} \cdot (\ln(x(k-1) - \ln(x(k)))) \text{ when } x(k) < x(k-1),$$

where C is the capacitance value of the capacitor, L is the inductance value of the inductor, R the resistance value of the resistor, $R_{EC}$ is the value of emitter-collector resistance of the first semiconductor switch, $V_0$ is the value of the supply voltage, 1/T is the value of the frequency of the first and second pulse width modulation units and x(k) is the value of the reference signal at the time k.

8. A circuit arrangement for generating waveforms, comprising:

a voltage transformer circuit for generating an output signal with a specific waveform; and a control circuit configured to control the voltage transformer circuit;

wherein the control circuit generates a first pulse-shaped control signal and a second pulse-shaped control signal to control the voltage transformer circuit;

wherein the voltage transformer circuit is configured so that a voltage of the output signal is increased by each pulse of the first pulse-shaped control signal and reduced by each pulse of the second pulse-shaped control signal;

wherein the control circuit is configured to compare the output signal of the voltage transformer circuit with a reference signal and generate the first and second control signals applied to the voltage transformer circuit dependent on the result of the comparison;

wherein the control circuit further comprises a control unit, a first pulse width modulation unit and a second pulse width modulation unit, where the control unit compares the output signal of the voltage transformer circuit with the reference signal and generates the first modulation signal for the first pulse width modulation unit and the second modulation signal for the second pulse width modulation unit dependent on the result of the comparison; and wherein the transformer circuit includes a capacitor, a resistor and an inductor and receives a supply voltage;

the first and second pulse width modulation units generate the first and second control signals, respectively, at a constant frequency; and the control unit is configured to define the pulse width of the first and second pulse width modulation units at least approximately on the basis of the expression:

$$\sqrt{2 \cdot C \cdot L \cdot (2 \cdot e(k) \cdot y(k) + e(k) \cdot e(k))}/(T \cdot V_0) \text{ when } e(k) > 0,$$

and define the pulse width of the first and second pulse width modulation units at least approximately on the basis of the expression:

$$-R \cdot C \cdot 1n(y(k)/(y(k)+e(k))/T \text{ when } e(k) > 0,$$

where C is the capacitance value of the capacitor, L is the inductance value of the inductor, R the resistance value of the resistor, $V_0$ is the value of the supply voltage, 1/T is the value of the frequency of the first and second pulse width modulation units, e(k) is the value of a differential signal at the time k and y(k) is the value of the output signal of the signal transformer circuit at the time k.

9. A circuit arrangement as defined in claim 8, wherein the first and second pulse width modulation units generate the first and second pulse-shaped control signals at a frequency of 128 kHz.

10. A telephone system utilizing the circuit arrangement as defined in claim 1, wherein the circuit arrangement is configured to generate sounds in a telephone within the telephone system.

* * * * *

UNITED STATES PATENT AND TRADEMARK OFFICE
CERTIFICATE OF CORRECTION

PATENT NO. : 7,053,676 B2  
APPLICATION NO. : 10/141558  
DATED : May 30, 2006  
INVENTOR(S) : Christian Kranz It is certified that error appears in the above-identified patent and that said Letters Patent is hereby corrected as shown below:

In the Claims:

Column 5, line 63, replace " $-\frac{L}{R_{EC} \cdot T} \cdot \ln\left(1 - \frac{R_{EC}}{V_0} \cdot \sqrt{\frac{C}{L}(x^2(k) = x^2(k-1))}\right)$ " with -- $-\frac{L}{R_{EC} \cdot T} \cdot \ln\left(1 - \frac{R_{EC}}{V_0} \cdot \sqrt{\frac{C}{L}(x^2(k) - x^2(k-1))}\right)$ --.

Column 6, line 7, replace " $-\frac{R \cdot C}{T} \cdot (\ln(x(k-1) - \ln(x(k)))$ " with -- $-\frac{R \cdot C}{T} \cdot (\ln(x(k-1)) - \ln(x(k)))$ --.

Column 6, line 62, replace "e(k)>0" with -- e(k)<0 --.

Signed and Sealed this

Third Day of April, 2007

JON W. DUDAS  
*Director of the United States Patent and Trademark Office*